(12) United States Patent
Kim et al.

(10) Patent No.: US 9,300,288 B2
(45) Date of Patent: Mar. 29, 2016

(54) TOUCH SENSOR PANEL AND METHOD FOR MANUFACTURING THE SAME

(71) Applicant: Samsung Display Co., Ltd, Yongin, Gyeonggi-Do (KR)

(72) Inventors: Duk-Sung Kim, Asan-si (KR); Sung Man Kim, Seoul (KR); Jong Hoon Kim, Hwaseong-si (KR)

(73) Assignee: Samsung Display Co., Ltd. (KR)

( * ) Notice: Subject to any disclaimer, the term of this patent is extended or adjusted under 35 U.S.C. 154(b) by 297 days.

(21) Appl. No.: 14/090,797

(22) Filed: Nov. 26, 2013

(65) Prior Publication Data

US 2014/0360855 A1 Dec. 11, 2014

(30) Foreign Application Priority Data

Jun. 7, 2013 (KR) .................. 10-2013-0065492

(51) Int. Cl.
*H03K 17/96* (2006.01)
*G06F 3/044* (2006.01)

(52) U.S. Cl.
CPC ............. *H03K 17/962* (2013.01); *G06F 3/044* (2013.01); *H03K 17/9622* (2013.01); *G06F 2203/04103* (2013.01); *H03K 2217/960755* (2013.01); *Y10T 29/49105* (2015.01)

(58) Field of Classification Search
CPC ............ Y10T 29/49117; Y10T 29/49105; G06F 3/044; G06F 2203/04103; H01H 1/00; H01H 13/70; H01H 2239/074; H01H 2203/008; H01H 2207/01; H01H 2221/00; H01H 2231/002; H01H 2231/012; H01H 2231/016; H01H 2231/052; H01H 2239/006; H03K 17/9622; H03K 17/962; H03K 2217/960755

USPC .............................. 200/5 R, 600; 29/622, 825
See application file for complete search history.

(56) References Cited

U.S. PATENT DOCUMENTS

| 8,466,882 B2* | 6/2013 | Halsey, IV | ............. | G06F 3/044 |
| | | | | 200/600 |
| 8,484,838 B2* | 7/2013 | Badaye | ................... | G06F 3/044 |
| | | | | 29/622 |
| 8,686,308 B2* | 4/2014 | Kuriki | .................... | G06F 3/044 |
| | | | | 200/512 |
| 2010/0006347 A1 | 1/2010 | Yang | | |
| 2010/0073310 A1 | 3/2010 | Liang et al. | | |
| 2010/0283757 A1 | 11/2010 | Wu et al. | | |
| 2011/0205168 A1 | 8/2011 | Jun et al. | | |
| 2011/0207055 A1 | 8/2011 | Jun et al. | | |
| 2011/0227840 A1 | 9/2011 | Sim et al. | | |

FOREIGN PATENT DOCUMENTS

| JP | 2011-191847 | 9/2011 |
| JP | 2012-185699 | 9/2012 |
| JP | 2012-220670 | 11/2012 |
| JP | 2013-015614 | 1/2013 |
| KR | 10-2013-0011267 A | 1/2013 |
| KR | 10-2014-0034979 A | 3/2014 |

\* cited by examiner

*Primary Examiner* — Edwin A. Leon
(74) *Attorney, Agent, or Firm* — Innovation Counsel LLP

(57) ABSTRACT

A method for manufacturing a touch sensor panel with a reduced number of masks includes forming a first resist layer with both full and partial thickness patterns, the latter being at a region corresponding to a plurality of first sensor electrodes; etching a first transparent conductive layer and a first other conductive layer using the first resist layer patterns having both full and partial thicknesses; forming a second resist layer with both full and partial thickness patterns, the latter being at a region corresponding to a plurality of second sensor electrodes; and etching while using the second resist layer patterns.

14 Claims, 6 Drawing Sheets

TOUCH SENSOR PANEL AND METHOD FOR MANUFACTURING THE SAME

CROSS-REFERENCE TO RELATED APPLICATION

This application claims priority to and the benefit of Korean Patent Application No. 10-2013-0065492 filed in the Korean Intellectual Property Office on Jun. 7, 2013, the entire contents of which application are incorporated herein by reference.

BACKGROUND (a) Field

The present disclosure of invention relates to a touch sensor panel and a method for manufacturing the same, and more particularly, to a capacitive touch sensor panel and a method for manufacturing the same.

(b) Description of Related Technology

A touch sensor panel is an input device which can recognize finger or alike contact positions of a user so as to interpret such contacts as possible user gesture commands. The touch sensor panel is provided on a front surface of a display device, and recognizes a contact position of a hand part or other object to determine an input signal. Touch sensor panels come in different types including a resistive type touch sensor panel, a capacitive type touch sensor panel, an infrared type touch sensor panel, and an ultrasonic type touch sensor panel. In general, the resistive touch sensor panel and the capacitive touch sensor panel are the most popular among the different types. In particular, the capacitive type touch sensor panel is preferred in a structure in which micro electrode patterns can be easily formed and where a relatively small thickness is desired.

In general, during a process of manufacturing the capacitive type touch sensor panel, four lithographic masks are used. However, the use of that many masks increases the manufacturing cost and increases the danger that one of the masking steps will include a manufacturing defect. Thus it would be desirable to be able to reduce the number of masking steps required during mass production fabrication of capacitive type touch sensor panels.

It is to be understood that this background of the technology section is intended to provide useful background for understanding the here disclosed technology and as such, the technology background section may include ideas, concepts or recognitions that were not part of what was known or appreciated by those skilled in the pertinent art prior to corresponding invention dates of subject matter disclosed herein.

SUMMARY

The present disclosure of invention provides a touch sensor panel that is simpler to manufacture and a method for manufacturing the same. More specifically, the method is capable of reducing the number of masks used during a mass production manufacturing a capacitive type touch sensor panel and thus simplifying the manufacturing process and reducing danger of defects due to larger numbers of lithographic steps.

An exemplary method for manufacturing a touch sensor panel is provided where the panel comprises a first plurality of interconnection electrodes interconnecting a plurality of first sensor electrodes in a first direction and a second plurality of interconnection electrodes interconnecting a plurality of second sensor electrodes in a different second direction. The mass produced panel further comprises a first lead line connecting an interconnected plurality of the first sensor electrodes to a first pad, and a second lead line connecting an interconnected plurality of the second sensor electrodes to a second pad. The method comprises: forming a first transparent conductive layer (TCL1) over a substrate, and forming a first other conductive layer (OCL1) over the first transparent conductive layer; forming a first resist layer pattern having full thickness at regions corresponding to the first lead line, the first pad, and the plurality of interconnection electrodes using a first mask, and simultaneously forming the first second resist layer pattern to have a lesser, partial thickness at a region corresponding to the plurality of first sensor electrodes; etching the first transparent conductive layer and the first other conductive layer using the first resist layer patterns; forming an insulating layer on the entire top surface of the substrate, forming a second transparent conductive layer (TCL2) over the insulating layer, and forming a second other conductive layer (OCL2) over the second transparent conductive layer; forming a second resist layer pattern having full thickness at regions corresponding to the plurality of interconnection electrodes, the second lead line, and the second pad using a second mask, and forming the second resist layer pattern to have a lesser, partial thickness at a region corresponding to the plurality of second sensor electrodes; and etching the insulating layer, the second transparent conductive layer, and the second other conductive layer using the second resist layer patterns.

The etching of the first transparent conductive layer and the first other conductive layer using the first resist layer patterns may comprise etching the first transparent conductive layer and the first other conductive layer at regions other than the regions where the first resist layer patterns are formed, through a first etching process.

The etching of the first transparent conductive layer and the first other conductive layer using the first resist layer patterns may further comprise: leaving behind part of the full thickness portions of the first resist layer pattern while removing the thinner partial thickness section of the first resist layer pattern through a first ashing process, after the first etching process; etching the first other conductive layer at the region corresponding to the plurality of first sensor electrodes through a second etching process; and removing the remainder of the first resist layer pattern.

The etching of the insulating layer, the second transparent conductive layer, and the second other conductive layer using the second resist layer patterns may comprise etching the second transparent conductive layer and the second other conductive layer at regions other than the regions where the second resist layer pattern is formed, through a third etching process.

The etching of the insulating layer, the second transparent conductive layer, and the second other conductive layer using the second resist layer patterns may further comprise: leaving behind part of the full thickness portions of the second resist layer pattern and removing the partial thickness portions of the second resist layer pattern through a second ashing process, after the third etching process; and etching the second other conductive layer at the region corresponding to the plurality of second sensor electrodes through a fourth etching process.

The etching of the insulating layer, the second transparent conductive layer, and the second other conductive layer using the second resist layer patterns may further comprise: etching the insulating layer exposed at regions other than the regions corresponding to the plurality of second sensor electrodes, the plurality of interconnection electrodes, the second lead line, and the second pad region, through a fifth etching process; and removing the remainder of the second resist layer pattern.

The first mask may comprise a light shielding portion formed at the regions corresponding to the first lead line, the first pad, and the plurality of interconnection electrodes, and a semitransparent portion formed at the region corresponding to the first sensor electrode.

The second mask may comprise a light shielding portion formed at the regions corresponding to the plurality of interconnection electrodes, the second lead line, and the second pad, and a semitransparent portion formed at the region corresponding to the plurality of second sensor electrodes.

A touch sensor panel in accordance with the present disclosure comprises: a plurality of first sensor electrodes; a plurality of second sensor electrodes; a plurality of interconnection electrodes interconnecting the plurality of first sensor electrodes one to the next along a first direction and interconnecting the plurality of second sensor electrodes one to the next along a second direction; a first lead line connecting an interconnected plurality of the first sensor electrodes to a first pad; and a second lead line connecting an interconnected plurality of the second sensor electrodes to a second pad. Each of the first sensor electrodes comprises a first transparent conductive layer formed over a substrate, and each of the second sensor electrodes comprises an insulating layer formed over the substrate and a second transparent conductive layer formed over the insulating layer.

The first lead line and the first pad may comprise: the first transparent conductive layer formed over the substrate; and a first other conductive layer formed over the first transparent conductive layer.

The plurality of interconnection electrodes may comprise: the first transparent conductive layer formed over the substrate; the first other conductive layer formed over the first transparent conductive layer; an insulating layer formed over the first other conductive layer; the second transparent conductive layer formed over the insulating layer; and a second other conductive layer formed over the second transparent conductive layer.

The second lead line and the second pad may comprise: the insulating layer formed over the substrate; the second transparent conductive layer formed over the insulating layer; and the second other conductive layer formed over the second transparent conductive layer.

The first transparent conductive layer and the second transparent conductive layer may be made of at least one of indium tin oxide (ITO) or indium zinc oxide (IZO).

At least one of the first and second other conductive layers may be made of a metallic material.

According to the exemplary teachings of the present disclosure of invention, it is possible to reduce the number of masks used in the process of manufacturing the touch sensor panel, simplify the manufacturing process, reduce the manufacturing cost of the touch sensor panel and reduce the danger of having defects due to larger numbers of lithographic processes.

In particular, the manufacturing process for the touch sensor panel may be performed without using an additional mask beyond the mentioned first and second mask for patterning the insulating layer of the touch sensor panel.

DETAILED DESCRIPTION

Figure 1:
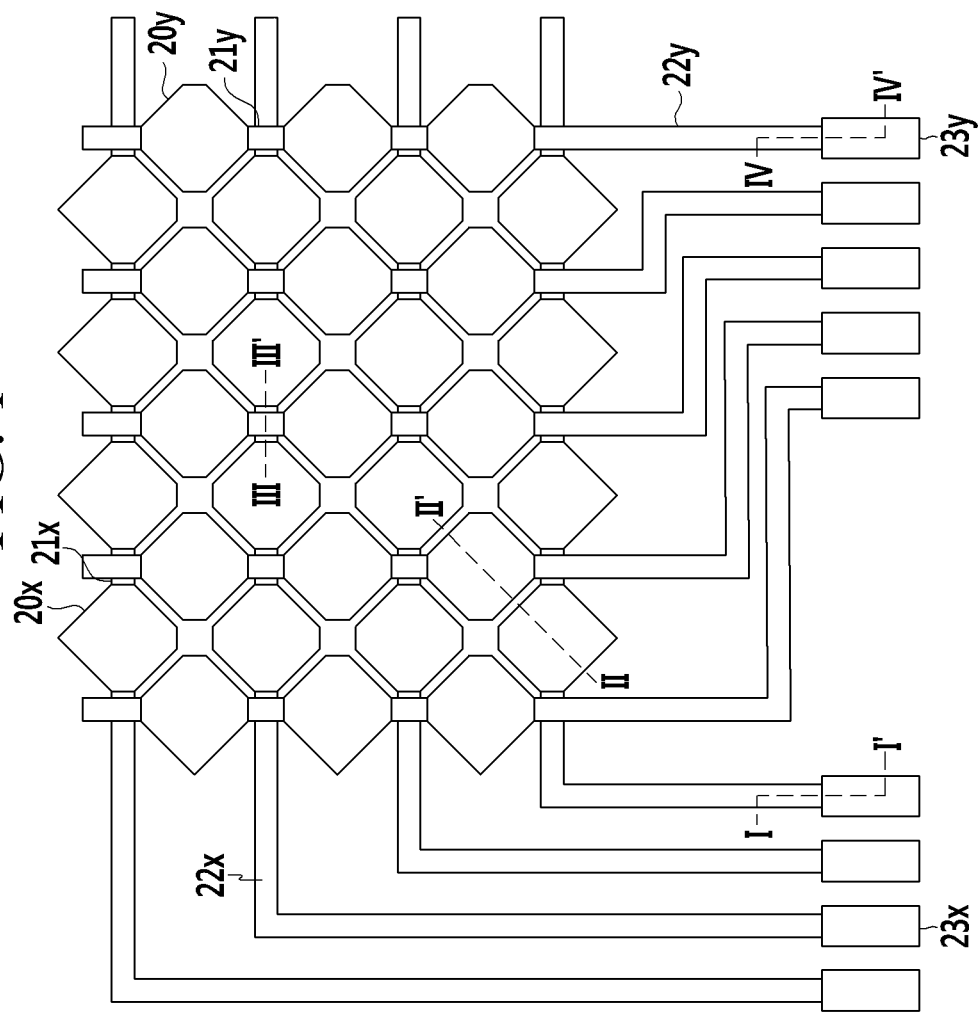
FIG. 1 is a top plan view of a touch sensor panel according to an exemplary embodiment of the present disclosure of invention.

In the following detailed description, only certain exemplary aspects of the present disclosure of invention are shown and described, simply by way of illustration. As those skilled in the art would realize in view of the present disclosure, the described embodiments may be modified in various different ways, all without departing from the spirit or scope of the present teachings.

In a variety of exemplary embodiments, constituent elements having the same structure will be representatively described in a first exemplary embodiment, through like reference numerals. In the other exemplary embodiments, the descriptions thereof will be focused on different constituent elements from those of the first exemplary embodiment.

In order to clearly provide the relevant teachings, parts unrelated to the teachings will be omitted. Throughout the disclosure, like reference numerals refer to like or similar constituent elements.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present. In contrast, when an element is referred to as being "directly on" another element, there are no intervening elements present.

FIG. 1 is a top plan view of a touch sensor panel according to an exemplary embodiment in accordance with the present disclosure of invention.

Referring to FIG. 1, the touch sensor panel comprises a plurality of sensor electrodes $20x$ and $20y$ for sensing a touch position and providing corresponding touch position signals. The sensor electrodes $20x$ and $20y$ are positioned to overlap light outputting areas (e.g., pixels) in a display area (DA) of a corresponding image displaying device (e.g., LCD, OLED, etc.) while areas away from the collection of sensor electrodes $20x$ and $20y$ may be positioned in so-called, peripheral areas of the image displaying device where images are not displayed. Additionally, small juncture areas (e.g., that of cross section III-III') between the sensor electrodes $20x$ and $20y$ may be positioned in non-displaying or black mask spots of the image displaying device (not shown).

The respective X and Y suffix notations of the $20x$ and $20y$ reference numbers indicate respective row and column axis associations. More specifically, the illustrated plurality of sensor electrodes $20x$ and $20y$ are formed to correspond respectively with sensing of position along an X-axis direction and along a Y-axis direction. The plurality of sensor electrodes $20x$ and $20y$ may comprise a horizontal row of first sensor electrodes $20x$ having the same Y coordinate and a vertical column of second sensor electrodes $20y$ having the same X coordinate. Each of the plurality of sensor electrodes in the central area $20x$ and $20y$ may have a rhombus like shape as viewed from the top, meaning that each has four straight primary edges of substantially equal lengths and may include additional segments. Pairs of the primary sides of the sensor electrodes $20x$ and $20y$ may be arranged in parallel to each other. In the illustrated embodiment, the central sensor electrodes each have the shape of a square (rotated 45 degrees from resting position) with two opposed ones of its corners identically cut so as to have four straight primary edges of larger length and two minor edges of respectively substantially identical but shorter lengths.

The plurality of sensor electrodes 20x and 20y are respectively connected one to the next only in the X-axis direction or only in the Y-axis direction through a respective plurality of connection electrodes 21x and 21y. That is, a row of first sensor electrodes 20x may be interconnected one to the next in the X-axis direction through a corresponding set of interposed first connection electrodes 21x. Similarly, a column of second sensor electrodes 20y may be interconnected one to the next in the Y-axis direction through a corresponding set of interposed second connection electrodes 21y. The X-axis direction and the Y-axis direction may be set perpendicular to each other. The first interconnection electrodes 21x and the second interconnection electrodes 21y cross each other, but are insulated from each other.

Each row of first sensor electrodes 20x are connected to a corresponding and at least one first pad 23x through a corresponding at least one first lead line 22x. Each column of second sensor electrodes 20y are connected to a corresponding and at least one second pad 23y through a corresponding at least one second lead line 22y.

Figure 2:
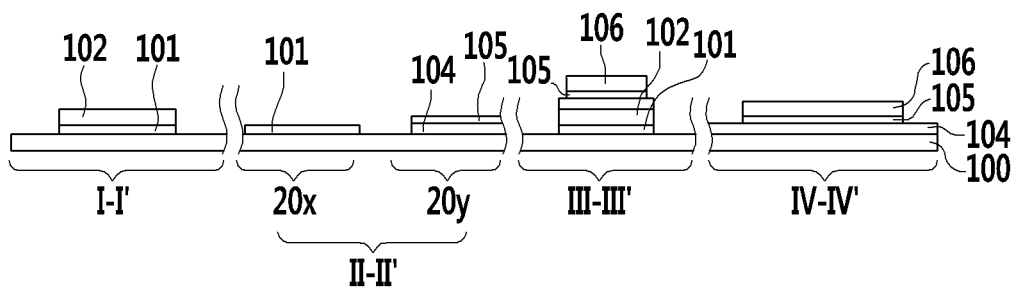
FIG. 2 is a cross-sectional view of the touch sensor panel according to the exemplary embodiment of FIG. 1.

The plurality of first pads 23x and the plurality of second pads 23y are connectable to an electronic controller (not shown), and the controller is configured to sense minute changes of charge (Q=VC) accumulated in each of the plurality of sensor electrodes 20x and 20y and to detect the coordinate of a contact position at which the expected amount of accumulated charge (Qinit) and/or its associated voltage (V=Q/C) is perturbed due to capacitive dispersion (e.g., due to a partially conductive body such as a user's finger tip being capacitively coupled to that area and thus changing total capacitance). FIG. 2 is a cross-sectional view of the touch sensor panel according to an exemplary embodiment of the present disclosure that has the top plan view layout of FIG. 1.

Referring to FIG. 2, it has four sections along its horizontal length respective denoted as sections I-I', II-II', III-III' and IV-IV'. Section I-I' corresponds to cross sectional line I-I' of FIG. 1 and illustrates the cross-sectional structure of the first lead line 22x and the first pad 23x. Section II-II' corresponds to cross sectional line II-II' and illustrates the cross-sectional structure of the first sensor electrode 20x and the second sensor electrode 20y. Section corresponds to cross sectional line III-III' and illustrates the cross-sectional structure of the connection electrodes 21x and 21y comprising the first connection electrode 21x and the second connection electrode 21y. Section IV-IV' corresponds to cross sectional line IV-IV' line of FIG. 1 and illustrates the cross-sectional structure of the second lead line 22y and the second pad 23y.

As seen in section I-I' of FIG. 2, the first lead line 22x and the first pad 23x comprise a first transparent conductive layer (TCL) 101 formed over a substrate 100 and a first other conductive layer (OCL) 102 formed over the first transparent conductive layer (TCL) 101. The substrate 100 may be made of a transparent material such as glass or plastic. The first transparent conductive layer (TCL) 101 may be made of a transparent material having electrical conductivity, such as indium tin oxide (ITO) or indium zinc oxide (IZO). The first other conductive layer (OCL) 102 may be made of a not necessarily light-passing material such as a metallic material having superior electrical conductivity. The metallic material having such superior electrical conductivity may comprise silver(Ag), gold (Au), platinum (Pt), copper (Cu), molybdenum (Mo), aluminum (Al) and the like. When the first lead line 22x and the first pad 23x are formed in an opaque region (e.g., peripheral area PA) at the edge of the touch sensor panel, the first other conductive layer (OCL) 102 is, as mentioned, not necessarily made of a transparent material, and may be made of an opaque material such as an opaque metallic material.

As seen in section II-II' of FIG. 2, the first sensor electrode 20x comprises the first transparent conductive layer (TCL) 101 formed over the substrate 100. The second sensor electrode 20y comprises an insulating layer 104 formed over the substrate 100 and a second transparent conductive layer (TCL) 105 formed over the insulating layer 104. The insulating layer 104 may be made of an inorganic insulating material such as a silicon nitride (SiNx) and/or a silicon oxide (SiOx) and/or a silicon oxynitride (SiOxNy). The second transparent conductive layer (TCL) 105 may be made of a transparent material having electrical conductivity, such as ITO or IZO.

As seen in section III-III' of FIG. 2, the interconnection electrodes 21x and 21y comprise the first transparent conductive layer (TCL) 101 formed over the substrate 100, the first other conductive layer (OCL) 102 formed over the first transparent conductive layer (TCL) 101, the insulating layer 104 formed over the first other conductive layer (OCL) 102, a second transparent conductive layer (TCL) 105 formed over the insulating layer 104, and a second other conductive layer (OCL) 106 formed over the second transparent conductive layer (TCL) 105. The second other conductive layer (OCL) 106 may be made of a metallic material having superior electrical conductivity. Alternatively the second other conductive layer (OCL) 106 may be made of a transparent material having electrical conductivity such as ITO or IZO.

As seen in section IV-IV' of FIG. 2, the second lead line 22y and the second pad 23y comprise the insulating layer 104 formed over the substrate 100, the second transparent conductive layer (TCL) 105 formed over the insulating layer 104, and the second other conductive layer (OCL) 106 formed over the second transparent conductive layer (TCL) 105.

Next, referring to FIGS. 3 to 15, a method for manufacturing the touch sensor panel according to the exemplary embodiment and in accordance with the present disclosure of invention will be described.

FIGS. 3 to 15 are cross-sectional views illustrating successive steps in the method for manufacturing the touch sensor panel according to the exemplary embodiment.

Figure 3:
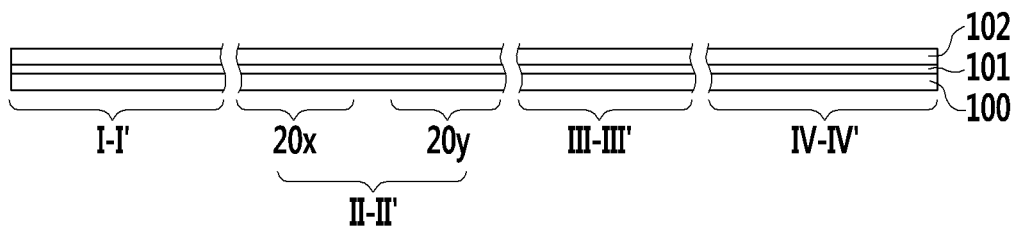
FIGS. 3 to 15 are cross-sectional views illustrating the method for manufacturing the touch sensor panel according to the exemplary embodiment of FIG. 1.

As shown in FIG. 3, a first transparent conductive layer (TCL) 101 made of a transparent material having electrical conductivity, such as ITO or IZO, is formed over a substrate 100 made of glass or plastic. The first transparent conductive layer (TCL) 101 may be formed over the substrate 100 through a deposition method such as physical vapor deposition (PVD) or chemical vapor deposition (CVD).

A first other conductive layer (OCL) 102 made of a metallic material is formed over the first transparent conductive layer (TCL) 101. The first other conductive layer (OCL) 102 may be formed over the first transparent conductive layer (TCL) 101 through a deposition method such as PVD or CVD.

Figure 4:
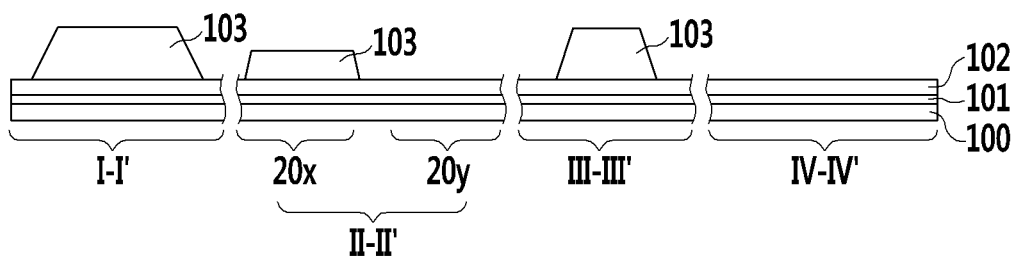

As shown in FIG. 4, a first halftone photomask or slit mask (hereafter also MASK1) is used to form a photoresist layer (PR) 103 of non-uniform thickness at regions corresponding to a first lead line 22x, a first pad 23x, a first sensor electrode 20x, and connection electrodes 21x and 21y. Hereinafter, it will be assumed that the resist layer 103 is a positive resist layer although similar processes can be implemented with a negative development type PR layer.

At this time, the first halftone photomask or slit mask (not shown, but understood from the illustrated formation of the corresponding first photoresist layer (PR) 103 of FIG. 4) comprises a light shielding portion formed at the regions corresponding to the first lead line 22x, the first pad 23x, and the connection electrodes 21x and 21y, a semitransparent portion formed at the region corresponding to the first sensor electrode 20x, and a transparent portion formed in the other regions. When the first halftone photomask or slit mask is used to perform exposure and development, the resist layer (103) corresponding to the transparent portion is completely exposed and completely removed after the development. Furthermore, since the resist layer corresponding to the light shielding portion is not exposed, most of the resist layer is left to form a first resist layer pattern of relatively maximum thickness. Furthermore, the resist layer corresponding to the semi-transparent portion is partially exposed to form a second resist layer pattern to a less than maximum (e.g., half) thickness corresponding to a part of the full thickness of the patterned resist layer 103.

That is, the first resist layer pattern having almost the same thickness as the resist layer is formed at the regions corresponding to the first lead line 22x, the first pad 23x and the connection electrodes 21x and 21y, and the second resist layer pattern having a smaller thickness than the first resist layer pattern is formed at the region corresponding to the first sensor electrode 20x.

Figure 5:
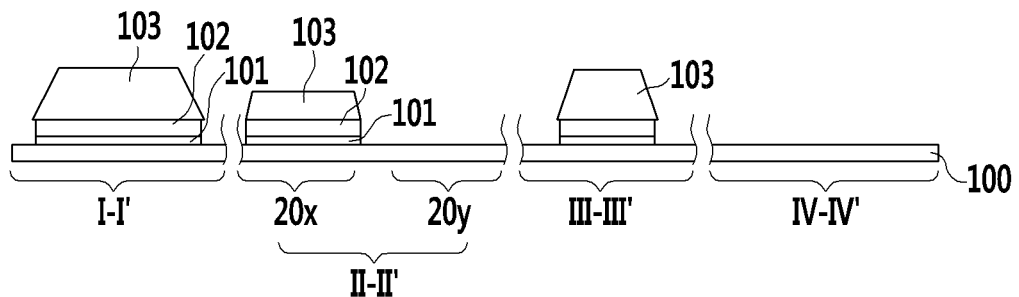

As shown in FIG. 5, the first transparent conductive layer (TCL) 101 and the first other conductive layer (OCL) 102 are etched away at all the regions other than the regions where the first resist layer pattern 103 is formed, through a suitable first etching process (e.g., an anisotropic reactive ion etch, RIE process). That is, the first transparent conductive layer (TCL) 101 and the first other conductive layer (OCL) 102 at the regions corresponding to the fully transparent portions of the first halftone photomask or slit mask are etched away.

Figure 6:
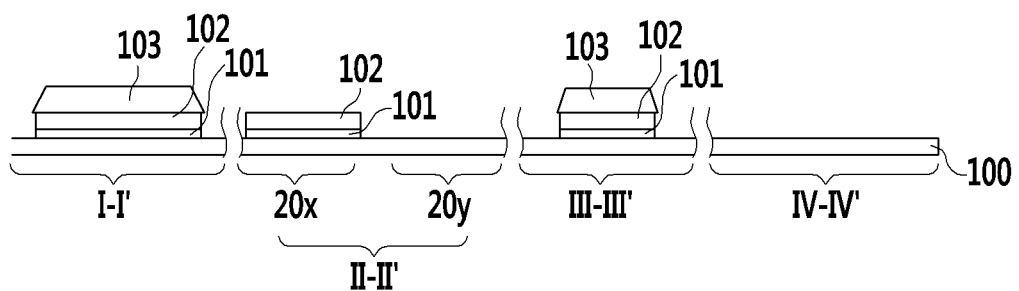

Next a partial removal (e.g., via ashing) is performed on the half-tone patterned first PR layer 103 and, as shown in FIG. 6, when the first resist layer patterns are so partially and properly removed through a first partial removal process after the first etching process, the partial thickness portion of the first resist layer pattern 103 is removed because that partial thickness portion has a relatively small thickness, and the lower layer at the region where the partial thickness portion of the first resist layer pattern 103 had been formed is newly exposed. That is, the first resist layer pattern at the regions corresponding to the first lead line 22x, the first pad 23x, and the connection electrodes 21x and 21y is left even after the partial removal (e.g., ashing) process, but the partial thickness portion of resist layer pattern 103 at the region corresponding to the first sensor electrode 20x is removed after the partial removal (e.g., ashing) process and the first other conductive layer (OCL) 102 at the region corresponding to the first sensor electrode 20x is exposed.

Figure 7:
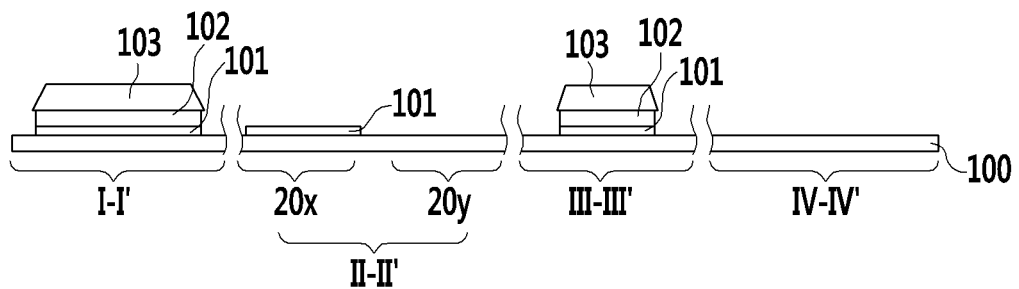

As shown in FIG. 7, the exposed portion of the first other conductive layer (OCL) 102 at the region corresponding to the first sensor electrode 20x is selectively removed (etched away) through a second etching process, for example that for selectively etching a metal. Since the first resist layer pattern 103 is left intact at the regions corresponding to the first lead line 22x, the first pad 23x, and the connection electrodes 21x and 21y, the first other conductive layer (OCL) 102 at the regions corresponding to the first lead line 22x, the first pad 23x, and the connection electrodes 21x and 21y may be left behind after the second etching process, and only the exposed first other conductive layer (OCL) 102 of the region corresponding to the first sensor electrode 20x may be etched.

Figure 8:
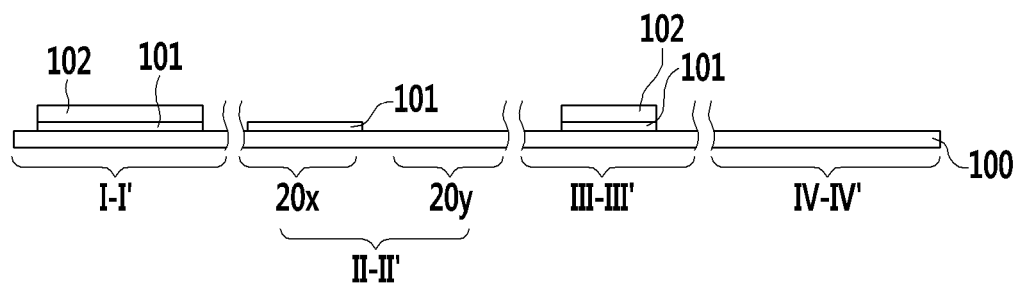

As shown in FIG. 8, the first resist layer pattern (PR) 103 is now fully removed (e.g., by way of an ashing or other appropriate and selective removal process). Then, the first transparent conductive layer (TCL) 101 formed over the substrate 100 and the first other conductive layer (OCL) 102 formed over the first transparent conductive layer (TCL) 101 are left at the region corresponding to the first lead line 22x and the first pad 23x. Furthermore, the first transparent conductive layer (TCL) 101 formed over the substrate 100 is left at the region corresponding to the first sensor electrode 20x, and no material is left over the substrate 100 at the region corresponding to the second sensor electrode 20y. The first transparent conductive layer (TCL) 101 formed over the substrate 100 and the first other conductive layer (OCL) 102 formed over the first transparent conductive layer (TCL) 101 are left at the region corresponding to the connection electrodes 21x and 21y. Furthermore, no material is left over the substrate 100 at the region corresponding to the second lead line 22y and the second pad 23y.

Figure 9:
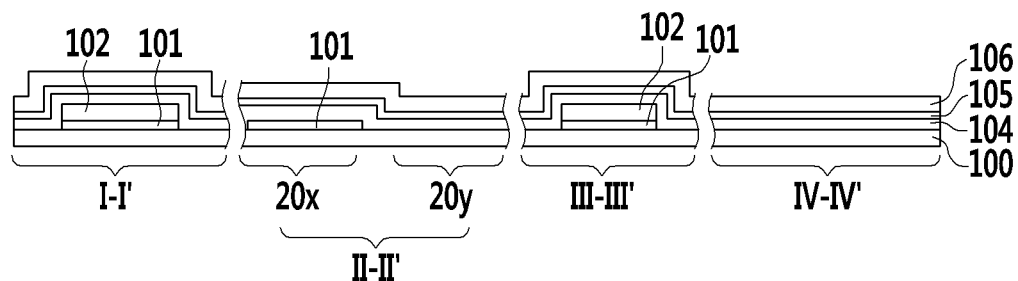

As shown in FIG. 9, next; an insulating layer 104 made of an inorganic insulating material such as SiNx or SiOx is formed on the entire top surface of the substrate 100 from which the first resist layer pattern (103) had been removed, a second transparent conductive layer (TCL) 105 made of a transparent material such as ITO or IZO is formed over the insulating layer 104, and the second other conductive layer (OCL) 106 is formed over the second transparent conductive layer (TCL) 105.

Figure 10:
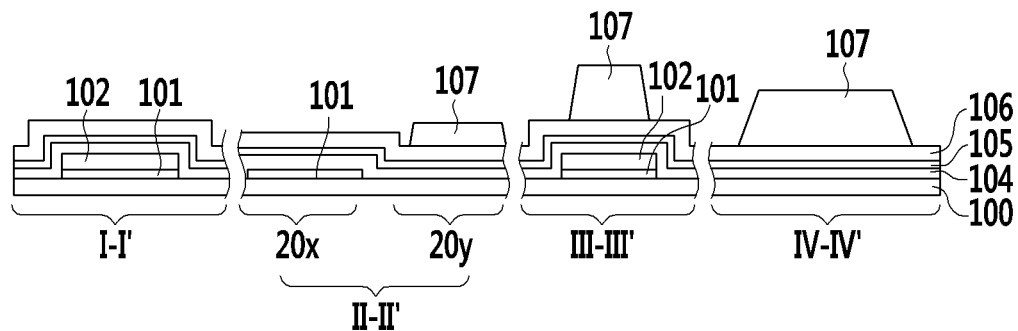

As shown in subsequent FIG. 10, a second halftone photomask or slit mask (not shown, but understood from the illustrated formation of the corresponding second photoresist layer (PR) 107 of FIG. 10) is used to form the resist layer 107 at the regions corresponding to the second sensor electrode 20y, the connection electrodes 21x and 21y, the second lead line 22y, and the second pad 23y. Hereinafter, it is assumed that the second resister layer 107 is a positive development type resist layer.

At this time, the second halftone photomask or slit mask (hereafter also MASK2) comprises a light shielding portion formed at the regions corresponding to the connection electrodes 21x and 21y, the second lead line 22y, and the second pad 23y, a semitransparent portion formed in the region corresponding to the second electrode 20y, and a transparent portion formed in the other regions. When the second halftone photomask or slit mask is used to perform exposure and development, the second resist layer portions corresponding to the fully transparent portions is completely exposed and completely removed after the development. Furthermore, since the second resist layer corresponding to the light shielding portion is not exposed, most of the initial thickness of the second resist layer is substantially left behind to form the illustrated second resist layer pattern. Moreover, the second resist layer portion corresponding to the semitransparent portion is partially exposed to thus form a partial thickness portion of the second resist layer pattern 107 to a thickness corresponding to a part of (e.g., half of) the full thickness of the second resist layer 107.

That is, the portions of the second resist layer pattern 107 having almost the same thickness as the pre-patterning resist layer is formed at the regions corresponding to the connection electrodes 21x and 21y, the second lead line 22y, and the second pad 23y. On the other hand, a partial thickness portion of the second resist layer pattern 107 having a smaller thickness is formed at the region corresponding to the second sensor electrode 20y.

Figure 11:
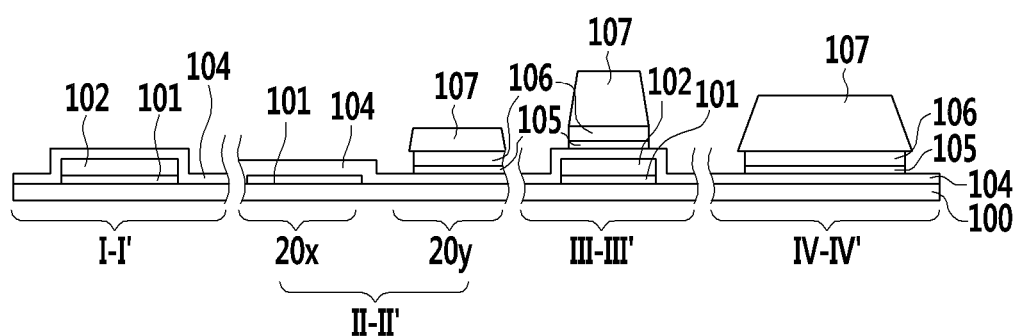

As shown in FIG. 11, the second transparent conductive layer (TCL) 105 and the second other conductive layer (OCL) 106 are etched at regions other than the regions in which the second resist layer pattern 107 is formed, through a third selective removal (e.g., anisotropic etching) process. That is, the exposed second transparent conductive layer (TCL) 105 and the second other conductive layer (OCL) 106 at the regions corresponding to the transparent portion of the second halftone photomask or slit mask (MASK2) are fully etched.

Figure 12:
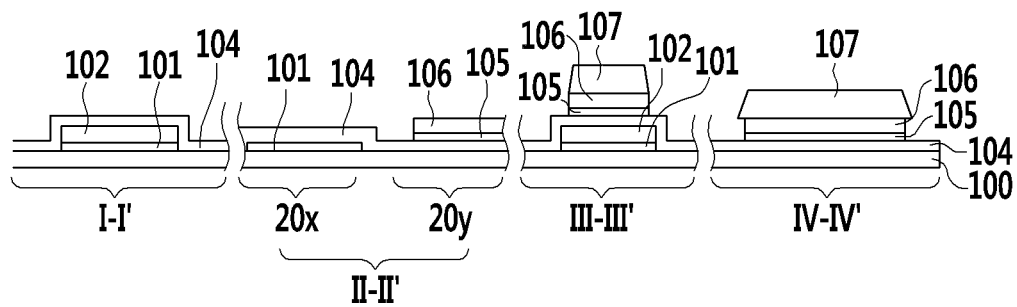

As shown in FIG. 12, when the second resist layer pattern is partially and properly removed through a second selective removal (e.g., ashing) process after the third etching process, the thinner portion of the second resist layer pattern 107 is removed because the thinner portion has a small thickness, and the lower layer at the region where the thinner portion of the second resist layer pattern 107 had been formed is newly exposed. That is, while the second resist layer pattern 107 at the regions corresponding to the connection electrodes 21x and 21y, the second lead line 22y, and the second pad 23y is left behind even after the second selective removal (e.g., ashing process), the thinner portion of the second resist layer pattern 107 at the region corresponding to the second sensor electrode 20y is removed after the removal (e.g., ashing) process, and the second other conductive layer (OCL) 106 at the region corresponding to the second sensor electrode 20y is exposed.

Figure 13:
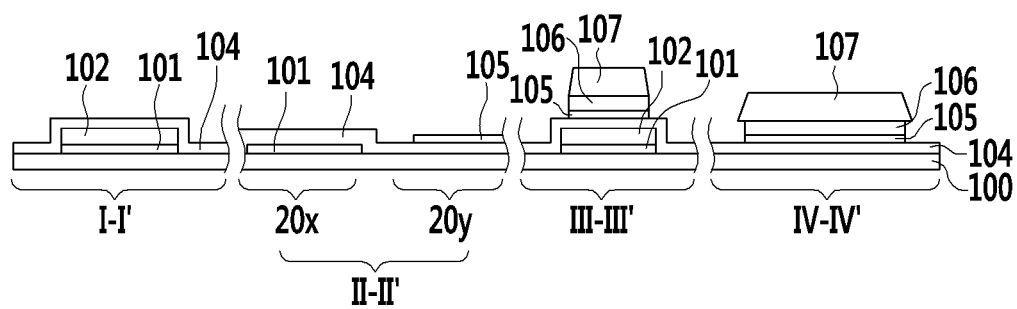

As shown in FIG. 13, the second other conductive layer (OCL) 106 at the region corresponding to the second sensor electrode 20y is etched through a fourth etching process for example that selective for etching a metal. Since the second resist layer pattern 107 is left at the regions corresponding to the connection electrodes 21x and 21y, the second lead line 22y, and the second pad 23y, the second other conductive layer (OCL) 106 at the regions corresponding to the connection electrodes 21x and 21y, the second lead line 22y, and the second pad 23y may be left during the fourth etching process, and only the second other conductive layer (OCL) 106 at the region corresponding to the second sensor electrode 20y may be etched away.

After the fourth etching process, the insulating layer 104 is exposed at regions other than the regions corresponding to the second sensor electrode 20y, the connection electrodes 21x and 21y, the second lead line 22y, and the second pad 23y.

Figure 14:
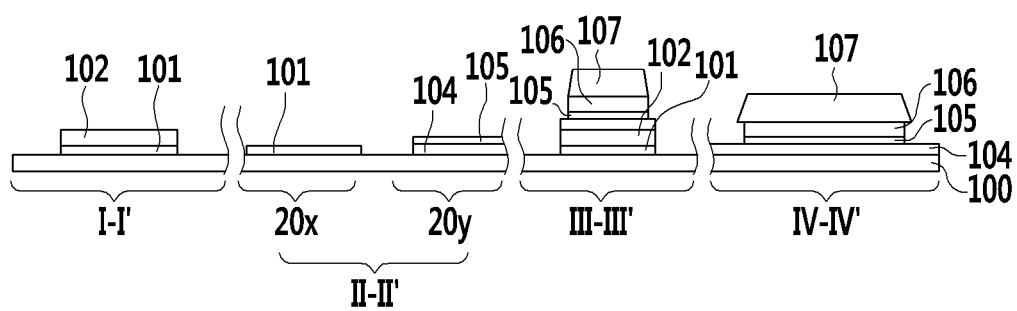

As shown in FIG. 14, the insulating layer 104 exposed at the regions other than the regions corresponding to the second sensor electrode 20y, the connection electrodes 21x and 21y, the second lead line 22y, and the second pad 23y is selectively etched away through a fifth etching process, for example that selective for etching an inorganic insulating material such as SiNx or SiOx.

As such, the second halftone photomask or slit mask (MASK2) may be used to form the resist layer 107 at the regions corresponding to the second sensor electrode 20y, the connection electrodes 21x and 21y, the second lead line 22y, and the second pad 23y, and the insulating layer 104 may be then removed through the third and fourth etching processes. Thus, a third and additional mask for patterning the insulating layer 104 does not need to be used.

Figure 15:
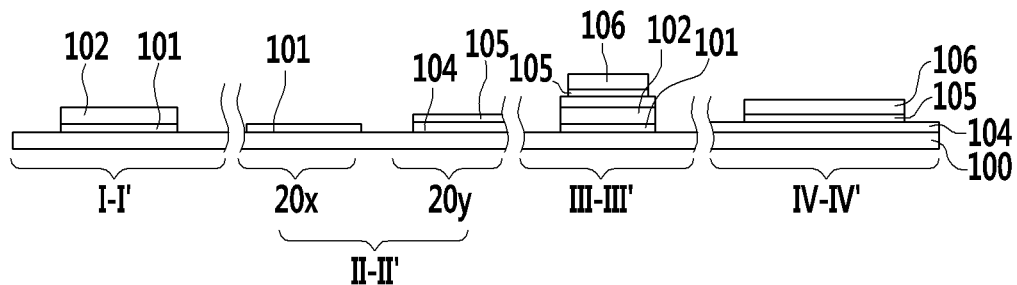

As shown in FIG. 15, the remainder of the second resist layer pattern 107 is removed. Then, the first transparent conductive layer (TCL) 101 formed over the substrate 100 and the first other conductive layer (OCL) 102 formed over the first transparent conductive layer (TCL) 101 are left at the region corresponding to the first lead line 22x and the first pad 23x. The first transparent conductive layer (TCL) 101 formed over the substrate 100 is left at the region corresponding to the first sensor electrode 20x. The insulating layer 104 formed over the substrate 100 and the second transparent conductive layer (TCL) 105 formed over the insulating layer 104 are left at the region corresponding to the second sensor electrode 20y. The first transparent conductive layer (TCL) 101 formed over the substrate 100, the first other conductive layer (OCL) 102 formed over the first transparent conductive layer (TCL) 101, the insulating layer 104 formed over the first other conductive layer (OCL) 102, the second transparent conductive layer (TCL) 105 formed over the insulating layer 104, and the second other conductive layer (OCL) 106 formed over the second transparent conductive layer (TCL) 105 are left at the region corresponding to the connection electrodes 21x and 21y. Furthermore, the insulating layer 104 formed over the substrate 100, the second transparent conductive layer (TCL) 105 formed over the insulating layer 104, and the second other conductive layer (OCL) 106 formed over the second transparent conductive layer (TCL) 105 are left at the region corresponding to the second lead line 22y and the second pad 23y.

As described above, just the two halftone photomasks or slit masks (MASK1 and MASK2) may be used to manufacture a capacitive type touch sensor panel. Thus, the process of manufacturing the touch sensor panel may be simplified to thereby reduce the manufacturing cost of the touch sensor panel and reduce the number of mass production defects associated with using a greater number of lithographic steps.

The accompanying drawings and the exemplary embodiments of the present disclosure of invention are only examples of the present teachings, and are used to illustrate the present teachings without limiting the scope of the present disclosure. Thus, it will be understood by those of ordinary skill in the art and in view of the present disclosure that various modifications and equivalent embodiments may be made without departing from the spirit and scope of the present teachings.

What is claimed is:

1. A method for manufacturing a touch sensor panel which comprises a plurality of first interconnection electrodes connecting a plurality of first sensor electrodes in a first direction and a plurality of second interconnection electrodes connecting a plurality of second sensor electrodes in a different second direction, a first lead line connecting an interconnected plurality of first sensor electrodes to a first pad, and a second lead line connecting an interconnected plurality of second sensor electrodes to a second pad, the method comprising:

forming a first transparent conductive layer (TCL1) over a substrate, and forming a first other conductive layer (OCL1) over the first transparent conductive layer;

forming a first resist layer pattern (PR1) of relatively full thickness at regions corresponding to the first lead line, the first pad, and the plurality of connection electrodes using a first mask, and forming the first resist layer pattern (PR1) to have less than its full thickness at a region corresponding to the plurality of first sensor electrodes;

etching the first transparent conductive layer and the first other conductive layer using the first resist layer having the respective first full and partial thickness patterns;

forming an insulating layer on the entire top surface of the substrate, forming a second transparent conductive layer (TCL2) over the insulating layer, and forming a second other conductive layer (OCL2) over the second transparent conductive layer;

forming a second resist layer pattern (PR2) of relatively full thickness at regions corresponding to the plurality of interconnection electrodes, the second lead line, and the second pad using a second mask, and forming the second resist layer pattern (PR2) to have partial thickness less than its full thickness at a region corresponding to the plurality of second sensor electrodes; and etching the insulating layer, the second transparent conductive layer, and the second other conductive layer using the second resist layer having the respective second full and partial thickness patterns.

2. The method of claim 1, wherein:
the etching of the first transparent conductive layer and the first other conductive layer using the first resist layer patterns comprises
etching the first transparent conductive layer and the first other conductive layer at regions other than the regions where the first resist layer patterns are formed, through a first etching process.

3. The method of claim 2, wherein:
the etching of the first transparent conductive layer and the first other conductive layer using the first resist layer patterns further comprises:
partially removing the first resist layer so as to leave behind part of the full thickness portion of the first resist layer pattern while removing the partial thickness portions of the first resist layer pattern after the first etching process;
etching the first other conductive layer at the region corresponding to the plurality of first sensor electrodes through a second etching process; and
removing the remainder of the first resist layer pattern.

4. The method of claim 3, wherein:
the etching of the insulating layer, the second transparent conductive layer, and the second other conductive layer using the second resist layer patterns comprises
etching the second transparent conductive layer and the second other conductive layer at regions other than the regions where the second resist layer pattern is formed, through a third etching process.

5. The method of claim 4, wherein:
the etching of the insulating layer, the second transparent conductive layer, and the second other conductive layer using the second resist layer patterns further comprises:
partially removing the second resist layer so as to leave behind part of the full thickness portion of the second resist layer pattern while removing the partial thickness portions of the second resist layer pattern after the third etching process; and
etching the second other conductive layer at the region corresponding to the plurality of second sensor electrodes through a fourth etching process.

6. The method of claim 5, wherein:
the etching of the insulating layer, the second transparent conductive layer, and the second other conductive layer using the second resist layer patterns further comprises
etching the insulating layer exposed at regions other than the regions corresponding to the plurality of second sensor electrodes, the plurality of interconnection electrodes, the second lead line, and the second pad region, through a fifth etching process; and
removing the remainder of the second resist layer pattern.

7. The method of claim 1, wherein:
the first mask comprises a light shielding portion formed at the regions corresponding to the first lead line, the first pad, and the plurality of interconnection electrodes, and
a semitransparent portion formed at the region corresponding to the first sensor electrode.

8. The method of claim 1, wherein:
the second mask comprises a light shielding portion formed at the regions corresponding to the plurality of interconnection electrodes, the second lead line, and the second pad, and
a semitransparent portion formed at the region corresponding to the plurality of second sensor electrodes.

9. A touch sensor panel comprising:
a plurality of first sensor electrodes;
a plurality of second sensor electrodes;
a plurality of first interconnection electrodes interconnecting the plurality of first sensor electrodes along a first direction and a plurality of second interconnection electrodes interconnecting the plurality of second sensor electrodes along a different second direction;
a first lead line connecting an interconnected plurality of the first sensor electrodes to a first pad; and
a second lead line connecting an interconnected the plurality of the second sensor electrodes to a second pad,
wherein each of the first sensor electrodes comprises a first transparent conductive layer (TCL1) formed over a substrate, and each of the second sensor electrodes comprises an insulating layer formed over the substrate and a second transparent conductive layer (TCL2) formed over the insulating layer.

10. The touch sensor panel of claim 9, wherein:
the first lead line and the first pad comprise
the first transparent conductive layer (TCL1) formed over the substrate; and
a first other conductive layer (OCL1) formed over the first transparent conductive layer.

11. The touch sensor panel of claim 10, wherein:
the plurality of interconnection electrodes comprise
the first transparent conductive layer formed over the substrate;
the first other conductive layer formed over the first transparent conductive layer;
an insulating layer formed over the first other conductive layer;
the second transparent conductive layer formed over the insulating layer; and
a second other conductive layer (OCL2) formed over the second transparent conductive layer.

12. The touch sensor panel of claim 11, wherein:
the second lead line and the second pad comprise
the insulating layer formed over the substrate;
the second transparent conductive layer formed over the insulating layer; and
the second other conductive layer formed over the second transparent conductive layer.

13. The touch sensor panel of claim 12, wherein:
the first transparent conductive layer and the second transparent conductive layer are made of at least one of indium tin oxide (ITO) and indium zinc oxide (IZO).

14. The touch sensor panel of claim 12, wherein:
at least one of the first and second other conductive layers is made of a metallic material.

* * * * *